United States Patent [19]

Finelli et al.

[11] 4,057,431

[45] Nov. 8, 1977

[54] ETHYLENICALLY POLYURETHANE UNSATURATED COMPOSITION

[75] Inventors: Anthony F. Finelli, Akron; Shirish Jasani, Cuyahoga Falls, both of Ohio; Columbus Williams, Jr., Doerun, Ga.

[73] Assignee: The Goodyear Tire & Rubber Company, Akron, Ohio

[21] Appl. No.: 617,883

[22] Filed: Sept. 29, 1975

[51] Int. Cl.$^2$ .................. G03C 1/68; G08F 18/24
[52] U.S. Cl. .................. 96/115 R; 204/159.19; 260/77.5 AP; 260/77.5 CR; 260/77.5 AT; 96/35.1
[58] Field of Search .......... 96/115 R; 204/159.19; 260/77.5 AP, 77.5 CR, 77.5 AT; 96/35.1

[56] References Cited

U.S. PATENT DOCUMENTS

| | | | |
|---|---|---|---|
| 3,028,367 | 4/1962 | O'Brien | 260/77.5 |
| 3,100,759 | 8/1963 | Boussu et al. | 260/77.5 |
| 3,100,759 | 8/1963 | Boussu et al. | 260/77.5 |
| 3,245,941 | 4/1966 | Mayer et al. | 260/31.5 |
| 3,297,745 | 1/1967 | Fekete et al. | 260/471 |
| 3,509,234 | 4/1970 | Burlant et al. | 260/859 |
| 3,600,359 | 8/1971 | Miranda | 260/77.5 |
| 3,694,415 | 9/1972 | Honda et al. | 260/77.5 CR |
| 3,719,638 | 3/1973 | Huemmer et al. | 260/77.5 CR |
| 3,759,809 | 9/1973 | Carlick et al. | 204/159.23 |
| 3,864,133 | 2/1975 | Hisamatso et al. | 96/115 R |

*Primary Examiner*—Jack P. Brammer
*Attorney, Agent, or Firm*—F. W. Brunner; J. D. Wolf

[57] ABSTRACT

A liquid ethylenically unsaturated polurethane composition having no free NCO and a viscosity of 2,000 to 10,000 centipoises at 24° C. dispersible in dilute caustic and capable of being polymerized by actinic light to yield a solid having a Shore A hardness of at least 30. Said composition may contain a diluent and a photosensitizing agent to adjust the viscosity and making the composition more readily utilizable for making printing plates.

10 Claims, No Drawings

ETHYLENICALLY POLYURETHANE UNSATURATED COMPOSITION

This invention relates to a method of making liquid photopolymer compositions. More particularly, this invention relates to a method of making liquid photopolymer compositions which are essentially free of large amounts of volatile unsaturated photocurable monomers and to the use of said photopolymer compositions in producing plates suitable for use in printing.

Photopolymers have been taught and used in making plates for printing such as letter press or gravure plates or the so-called relief plates. The compositions utilizable heretofore contained a relatively large amount of volatile unsaturated photocurable monomers which had to be removed during the preparation of the plates and appreciably contaminated the atmosphere as well as the material being used to wash the unpolymerized polymer away from the polymerized polymer during the preparation of the printing plate.

Polyurethane polymerizable compositions have been taught by the following patents: U.S. Pat. Nos. 3,658,531, 3,677,920, 3,713,864, 3,782,961, British Pat. No. 1,321,108 and Japanese Pat No. 41,708/73, but unfortunately, these polyurethane photopolymerizable compositions have had extremely high viscosities and were not readily washed or removed from the polymerized material during the preparation of the plate.

It is an object of this invention to provide a liquid polymerizable composition having relatively low viscosity, relatively low amounts of nonvolatile diluent and the liquid polymerizable composition can be washed readily away from the polymerized polymer during the preparation of the printing plate.

Compositions in accordance with this invention can be prepared by forming a polyurethane by reacting a polyether polyol having 2 or 3 hydroxyls, with an organic polyisocyanate and a hydroxy alkyl methacrylate or acrylate where the alkyl radical has 2 or 3 carbon atoms. This reaction may occur in the presence of a diluent, preferably comprising a polyethylene polyol acrylate or methacrylate of 200 to 6000 and preferably 500 to 1500 molecular weight of polyethylene polyol with 2 to 4 hydroxyls in the presence of an organic tin catalyst and an antioxidant, or ultimately the isocyanate may be reacted and then the diluent and a fatty acid or a fat and the photosensitizing agent can be added thereto to obtain a liquid polymer composition having a viscosity of between about 2000 and 10,000 centipoises at 24° C. and preferably between about 3,000 to 6,000 centipoises. This liquid photopolymer composition can then be applied to a substrate and exposed to ultraviolet light of wavelengths of approximately 3000 to 4000 Angstrom units to effect polymerization of the polymer in those areas receiving the ultraviolet light to produce the desired printing plate. It should be understood that the ultraviolet light passes through a suitable image imparting medium before striking the photopolymerizable composition. The unpolymerized liquid photopolymer composition on the substrate after its exposure to ultraviolet light can be washed with slightly alkaline water or water containing a suitable detergent to remove the unpolymerized composition to leave a polymerized composition on the substrate having the desired printing characteristics on the substrate or printing plate. Alternately, the unpolymerized polymer may be removed by vacuum or air.

The nature of this invention may be more readily understood and appreciated by reference to the following representative examples wherein all parts and percentages are by weight unless otherwise indicated.

EXAMPLES 1 through 6

Liquid photopolymerizable compositions suitable for the preparation of printing plates were made by the recipes of Table 1:

Table 1

| Example No. | 1 | 2 | 3 | 4 | 5 | 6 |
|---|---|---|---|---|---|---|
| Polyether diol  Mol.Wt. | 3000 | 3000 | 1800 | 1800 | 3000 | 3000 |
| Parts | 2000 | 2000 | 1600 | 1600 | 800 | 800 |
| Isophorone Diisocyanate | 883 | 883 | 772 | 772 | 175 | 189 |
| Trimethylhexamethylene Diisocyanate | — | — | — | — | 166 | 178 |
| Hydroxyethyl Methacrylate | 1101 | 1101 | 760 | 760 | 436 | 470 |
| Polyethylene glycol 600 dimethacrylate | 200 | 200 | 158 | 158 | 80 | 80 |
| Oleic Acid | 104 | 104 | 95 | 95 | 50 | 50 |
| Photosensitizer | BIBE | DEAP | BIBE | DEAP | BIBE | BIBE |
| Agent | 174 | 174 | 158 | 158 | 80 | 80 |
| Hydroquinone | 1.0 | 1.0 | 4.0 | 4.0 | 2 | 2 |
| Catalyst - T-831* | 4.0 | 4.0 | 3.0 | 3.0 | 1.5 | 1.5 |
| Shore A Hardness | 95 | 95 | 96 | — | — | — |

*Catalyst T-831 is di(n-octyl)tin-S,S'-bis-(isooctyl mercaptoacetate).

In the table the recipe set forth for Examples 1, 2, 5 and 6 were mixed in the following order, namely, the polyether diol was placed in a suitable reaction kettle, then the isocyanate and the polyethylene glycol 600 dimethacrylate, where 600 indicates the molecular weight of polyethylene glycol along with the hydroquinone was added to the polyether diol. The mixture was degassed at room temperature for 1 hour and then the hydroxy ethyl methacrylate was added with stirring continuing for 10 minutes at atmospheric pressure. The catalyst was then added to the reactor and stirred for five minutes. The temperature of the reaction mixture was controlled by cooling the reaction vessel to see that the temperature did not rise above 77° C. The reaction mixture was allowed to stand for approximately 48 hours at room temperature after the exotherm had subsided and the resulting reaction product was analyzed for residual isocyanate content and usually was found to contain less than 0.5 percent free NCO. This free NCO content was then destroyed by the addition of the theoretical amount or a small excess of n-butanol to stabilize the viscosity of the resulting reaction product. For instance, the product obtained by Example 1 had a viscosity of 3200 centipoises at 24° C. after it had been stabilized by the addition of n-butanol and was substantially free of any offensive odor. The photosensitizing agent was added to this mixture in the amounts called for by the recipe and then the liquid photopolymerizable composition, for instance, the one of Example 1, was submitted to ultraviolet cure and the cured composition had a Shore A hardness of 95. In Example 4 the polyether diol, isophorone diisocyanate, hydroxyethyl methacrylate were first reacted to form the polyurethane and after standing for approximately 48 hours the free NCO was determined and destroyed by the addition of sufficient m-butanol to give a composition which was essentially free of isocyanate, then the oleic acid, polyethylene glycol 600 dimethacrylate and the photosensitizing agent, viz. DEAP, the abgreviation for 2,2-diethoxyacetophenone was added and stirred into the stabilized urethane mixture of Example 4 to give a photopolymer composition having a viscosity of 4100 centipoises at 24° C. This composition was substantially free of any offensive odor and could be readily cured upon exposure to ultraviolet light to produce a polymer on the substrate that was satisfactory as a printing plate and by using an aqueous detergent solution the unpolymerizable composition was readily removed from the polymer on the substrate.

In Examples 1, 2, 3, 4 and 5 above the polyether diol was one containing essentially 70 percent of groups derived from propylene oxide and 30 percent of groups derived from ethylene oxide and having approximately 80 percent primary hydroxyl groups. The polyether diol of Example 6 contained approximatley 92 percent groups derived from propylene oxide and 8 percent of groups derived from ethylene oxide to yield a diol having approximately 59 percent primary hydroxyl groups. The photosensitizer identified in Examples 1, 3, 5 and 6 as BIBE is benzoin isobutyl ether.

The photopolymerizable compositions of Examples 1 to 6 were tested for their ability to produce relief printing plates by spreading the compositions uniformly over a substrate such as an adhesive treated Mylar film or aluminum foil to the depth of 20 to 30 mils and then covered with polyethylene or Mylar film to remove or exclude air exposure to produce the test specimen. The composition on the specimen was exposed to two banks each of 10 Sylvania F40BL ultraviolet fluorescent bulbs, with one bank above and one below the specimen. The upper bank of lights adjusted to a power output of 850 to 1100 microwatts per square centimeter and the lower bank had a power output of 1500 to 1800. Usually the specimen was exposed 15 seconds to the upper bank of lights and 45 seconds to the lower bank.

The exposed specimens were washed with different aqueous solutions to remove the unpolymerized composition from the specimen and to leave the polymerized composition on the substrate to obtain the relief or printing plate.

The unpolymerized composition was readily removed from the specimen when washed with an aqueous soap solution or a dilute caustic solution. An excellent wash solution is a composition formed by mixing:
1 gallon water
5 grams commercial detergent (brand name Tide)
5 grams trisodium phosphate, and
5 grams antifoaming agent of the silicone type.

EXAMPLE 7

Into a suitable reactor were charged 400 parts of a 3000 molecular weight polyether (Hydroxyl No. 39.2) with a 45 percent ethylene oxide and 55 percent propylene oxide content and containing 92.4 percent primary hydroxyl groups, 121.8 parts of 94 percent hydroxyethylmethacrylate, 1.0 part hydroquinone, 1.0 part Santowhite powder and 125.4 parts of isophorone diisocyanate. After mixing well, 1.0 part of catalyst T-831 was added and stirring was continued for 1 to 2 minutes. The reaction mixture was allowed to stand at room temperature. After 18 hours the fluid material was analyzed for percent isocyanate content (percent NCO) and showed 1.0 percent NCO. After an additional 48 hours at room temperature 5.5 parts n-butanol was added and stirred in well.

The fluid polymer was compounded by adding 19 parts of oleic acid and 32 parts 2,2-diethoxyacetophenone to 641 parts of the reaction mixture. The mix was stirred well and allowed to stand. After 48 hours the viscosity of the compounded photopolymer was 3850 centipoises, satisfactory for the preparation of relief printing plates. It should be noted this polyurethane photopolymer composition was made without diluent.

EXAMPLE 8

In a similar experiment the mole ratio of diisocyanate to the polyether was raised to 6.0 $R_y$ where $R_y$ represents the ratio of diisocyanate to moles of polyether diol by charging into the reactor the following recipe:

|  | Parts |
| --- | --- |
| Polyether of Example 7 | 400 |
| Hydroxyethyl methacrylate | 203 |
| Isophorone diisocyanate | 188 |
| Hydroquinone | 1.0 |
| Santowhite Powder | 1.0 |
| Catalyst T-831 | 1.0 |

After 18 hours at room temperature the material was analyzed for percent isocyanate content (% NCO) and showed 1.1 percent NCO. After an additional 48 hours at room temperature, 6.1 parts of n-butanol was added and stirred in well. The fluid polymer was compounded by adding 23.4 parts of oleic acid and 39 parts of 2,2-diethoxyacetophenone to 780 parts of the polymer. After stirring well, the mixture was allowed to stand at room temperature.

To five parts of the compounded photopolymer was added 50 parts of a wash solution prepared from a commercial detergent of the brand name of Tide, trisodium phosphate and anti-foam agent in water. After shaking well the mixture formed an emulsion indicating it would have good washout properties for the unexposed photopolymer.

The compounded photopolymer showed viscosity of 3720 centipoises and was unsatisfactory for the preparation of relief printing plates and exhibited excellent wash properties.

EXAMPLE 9

A reactory was charged with 400 parts of a polyol (Hydroxyl No. 105.5) containing 77 percent primary hydroxyl groups and prepared from ethylene oxide and propylene oxide, 328 parts of hydroxyethyl methacrylate, 338 parts of isophorone diisocyanate, 1.0 part hydroquinone, 1.0 part Santowhite and 1.0 part of catalyst T-831. The temperature rose to a maximum of 178° F. in 23 minutes. After one hour the temperature was 57° C. and after 1½ hours it was down to 48° C.

After standing at room temperature for three days the material was analyzed for percent isocyanate content and showed 0.67 percent NCO. The polymer was then treated with 10 parts of n-butanol.

The next day the photopolymer (1070 parts) was compounded with oleic acid (32 parts), polyethylene glycol 600 dimethacrylate (53 parts), 2,2-diethoxyacetophenone (53 parts). The mixture was stirred well and allowed to stand. The next day the liquid photopolymer had a viscosity of 8000 centipoises at room temperature. the viscous photopolymers require care in handling to produce bubble-free castings for relief printing plates.

EXAMPLE 10

Photopolymers were prepared from the following polyols according to the recipe. Pluronic L-31, 950 molecular weight and with a 10 percent ethylene oxide and 90 percent propylene oxide content is a commercial brand of polyether glycol. Pluronic L-42, 1200 molecular weight and with a 20 percent ethylene oxide and 80 percent propylene oxide content is a commercial brand of polyether glycol.

|  | −1 Moles | −2 Moles |
|---|---|---|
| Pluronic L-31 | 1.0 |  |
| Pluronic L-42 |  | 1.0 |
| Isophorone Diisocyanate | 4.0 | 4.0 |
| Hydroxyethyl methacrylate | 6.18 | 6.18 |
| $R_y$ | 4.0 | 4.0 |
| $R_A$ | 1.03 | 1.03 |

$R_A$ designates ratio of excess isocyanate on polyether polyol basis to hydroxyl alkylacrylate.

To 400 parts of the photopolymer from the above recipe was added 4.0 parts of n-butanol, 12 parts oleic acid, 20 parts polyethylene glycol dimethacrylate and 20 parts 2,2-diethoxyacetophenone. The reaction mixture was stirred well and allowed to stand at room temperature.

After 2 days the viscosity of the photopolymers were taken. The photopolymer based on the L-31 polyether (−1) showed a viscosity of 8500 centipoises. The photopolymer based on the L-42 polyether showed 12,900 centipoises poises and is not suitable for processing printing plates at ambient temperature although it could be used where the photopolymer is warmed. The L-31 polyether produces a photopolymer that tends to yield plates with a high bubble content.

EXAMPLES 11 through 14

A series of liquid photopolymers suitable for making printing plates at different $R_A$ levels were prepared in the following manner:

| Example No. | 11 | 12 | 13 | 14 |
|---|---|---|---|---|
| 3000 Mol.Wt. polyether diol (parts) | 400 | 400 | 400 | 400 |
| Isophorone diisocyanate | 177 | 177 | 177 | 177 |
| Polyethylene glycol 600 dimethacrylate | 40 | 40 | 40 | 40 |
| Hydroquinone | 0.2 | 0.2 | 0.2 | 0.2 |
| Santowhite powder | 0.4 | 0.4 | 0.4 | 0.4 |
| $R_y$ (NCO/OH polyether) | 6.0 | 6.0 | 6.0 | 6.0 |
| HEMA $R_A$ (OH acrylate/NCO) |  |  |  |  |
| 1.05 | 193 |  |  |  |
| 1.1 |  | 202 |  |  |
| 1.15 |  |  | 211 |  |
| 1.2 |  |  |  | 220 |
| T-831 | 1.0 | 1.0 | 1.0 | 1.0 |
| Percent Excess HEMA monomer | 1.2 | 2.3 | 3.5 | 4.4 |
| Percent NCO after 48 hours | 1.1 | 0.99 | 0.99 | 0.88 |
| Stabilized with n-butanol 72 hours (parts) | 10 | 10 | 10 | 10 |

The procedure used to make photopolymer solutions was the one-shot method, although the prepolymer method could have been used. The polyether diol used was one of approximately 3000 molecular weight (Hydroxyl No. 37.1) with 89.2 percent primary hydroxyl groups and made with 30 percent ethylene oxide and 70 percent propylene oxide.

Approximately 48 hours before starting the UV cure studies each solution was compounded with 3 parts oleic acid and 5 parts 2,2-diethoxyacetophenone per 100 parts photopolymer.

| Photopolymer of Examples | 11 | 12 | 13 | 14 |
|---|---|---|---|---|
| Viscosities, centipoises | 3040 | 2600 | 2300 | 2200 |

After UV cure using a film negative the photopolymer in the unexposed area may be effectively removed with aqueous detergent solution.

EXAMPLES 15 through 19

A series of liquid photopolymers suitable for making printing plates were made from polyether diols at different percent EO levels in the following manner:

| Example No. | 15 | 16 | 17 | 18 | 19 |
|---|---|---|---|---|---|
| Polyether diol |  |  |  |  |  |
| Mol. Wt. | 2826 | 3000 | 3024 | 3016 | 2862 |
| Percent EO | 8 | 12.4 | 17.2 | 30 | 39.2 |
| Recipe |  |  |  |  |  |
| Polyether diol (parts) | 400 | 400 | 400 | 400 | 400 |
| IPDI at $R_y$ = 6.0 | 188 | 178 | 176 | 177 | 186 |
| HEMA at $R_A$ = 1.2 | 235 | 221 | 220 | 220 | 232 |
| Polyethylene glycol 600 dimethacrylate | 40 | 40 | 40 | 40 | 40 |
| Hydroquinone | 0.2 | 0.2 | 0.2 | 0.2 | 0.2 |
| Santowhite | 0.4 | 0.4 | 0.4 | 0.4 | 0.4 |
| Catalyst T-831 | 1.0 | 1.0 | 1.0 | 1.0 | 1.0 |
| Percent NCO after 48 hours | 0.38 | 0.38 | 0.29 | 0.38 | 0.34 |
| Stabilized with n-butanol | 10 | 10 | 10 | 10 | 10 |

The procedure used to make photopolymer solutions is the same as used in Example 11. Approximately 48 hours before starting the UV cure studies, each solution was compounded with three parts oleic acid and five parts 2,2-diethoxyacetophenone per 100 parts of photopolymer solution.

| Photopolymers of Examples | 15 | 16 | 17 | 18 | 19 |
|---|---|---|---|---|---|
| Viscosities, centipoises | 2200 | 2020 | 2060 | 2130 | 2230 |

After exposure to the UV cure the unexposed polymer can be removed by wash with an aqueous detergent solution.

HEMA is the abbreviation for hydroxy ethyl methacrylate;

HEA is the abbreviation for hydroxy ethyl acrylate;

HPMA is the abbreviation for hydroxy propyl methacrylate;

HPA is the abbreviation for hydroxy propyl acrylate;

EO is the abbreviation for ethylene oxide level in the polyether polyol; and

IPDI is the abbreviation for isophorone diisocyanate.

In the foregoing exampes, HEMA has been used to illustrate the invention, but HEMA can be replaced with HEA or HPMA or HPA to produce a liquid ethylenically unsaturated polyurethane having no free NCO groups, dispersible in a dilute aqueous sodium hydroxide solution and having a viscosity at 25° C. of less than 15,000 centipoises, said ethylenic unsaturation being polymerizable to yield a solid having a Shore A hardness greater than 30. The preferred liquid polyurethanes of this invention have a carbon to oxygen ratio greater than 2 and less than 3 in the polyether polyol with the preferred ratio being 2.1 to 2.9.

The liquid polyurethanes of this invention preferably are compounded with or made ab initio with an ethylenically unsaturated diluent. This diluent preferably is an acrylate or methacrylate of a polyether polyol, preferably of diol or triol type where the polyether polyol has a molecular weight of 200 to 6000 and a carbon to oxygen ratio greater than 2.0 and less than 3.0. Where the diluent is water soluble or highly miscible with water the resulting polyurethane can be more easily dispersed in water.

The liquid polyurethanes, either with or without diluent, can be compounded with a photosensitizer such as those of U.S. Pat. No. 3,677,920 and preferably a fatty acid or fat to yield a photocurable polyurethane composition. Usually the photosensitizer or initiator are used in amounts of about 0.001 to 5 or more percent. The fatty acids, such as stearic, oleic, 2-ethylhexanoic are added to the composition to aid in dispersing the material during the caustic washing.

Known thermal polymerization inhibitors may be employed for the purpose of maintaining storage stability (shelf life) of the photopolymerizable compositions. Such stabilizers may be added when the components of a photopolymerizable composition are admixed or may be added to each component separately prior to admixing of the components.

Exemplary thermal polymerization inhibitors include hydroquinone, mono-tert-butyl hydroquinone, benzoquinone, 2,5-diphenyl-p-benzoquinone, pyridine, phenothiazine, p-diaminobenzene, beta-naphthol, naphthylamine, pyrogallol, cuprous chloride and nitrobenzene. These inhibitors are added only for completely preventing polymerization reaction without the actinic radiation set forth above without restraining the photopolymerization reaction. Consequently the amount of the stabilizers may preferably be about 0.005 to 3.0 percent by weight of the total weight of the photopolymerizable composition.

Examples of suitable known photopolymerization initiators include benzoins such as benzoin, α-methylbenzoin, benzoin methyl ether, benzoin ethyl ether, α-phenylbenzoin, α-allylbenzoin, phenones such as acetophenone, benzophenone, anthraquinones such as anthraquinone, chloroanthraquinone, methylanthraquinone, tert-butylanthraquinone; disulphides such as diphenyl disulphide, tetraethylthiuram disulphide; diketones such as benzyl, diacetyl; uranyl salts such as uranyl nitrate, uranyl propionate; 2-naphthalene sulfonyl chloride; metal halides such as silver chloride, silver bromide, stannic chloride, stannous chloride and titanium chloride.

These photopolymerization initiators are used in an amount of from 0.001 to 10 percent by weight based upon the total weight of the photopolymerizable composition. When the amount of the photopolymerization initiator is less than 0.001 percent by weight the photopolymerization reaction is greatly retarded and is too slow for practical commercial purposes. On the other hand, amounts of initiator of more than 10 percent by weight do not significantly increase the reaction and would be uneconomical. Usually 2 to 6 percent is used.

The foregoing examples have been exemplified with reactive hydroxy ethylenic monomers of the class of hydroxy alkyl acrylate or methacrylate but the hydroxy alkoxy acrylates or methacrylates where the alkoxy is a radical containing from 1 to 10 repeating groups of the formula (—$C_2H_4O$—) or (—$C_3H_6O$—) may be used, too.

EXAMPLE 20

An ethylenically unsaturated liquid polyetherurethane containing sufficient diacrylate of polyethylene ether glycol of 600 molecular weight to give a viscosity at 24° C. of 4000 centipoises was treated by adding to each 100 part aliquot 5 parts of DEAP and 3 parts of the following fatty acids, viz. oleic acid, stearic acid, lauric acid and caproic acid and mixing well. Five parts of these treated aliquots wre then placed in an 8-ounce bottle containing warm soapy water. Upon shaking all dispersed well. Dilute caustic, 1 to 5 Normal, could be used to disperse the liquid polyetherurethanes of this invention.

While certain representative embodiments and details have been shown for the purpose of illustrating the invention, it will be apparent to those skilled in the art that various changes and modifications may be made therein without departing from the spirit or scope of the invention.

What is claimed is:

1. A liquid ethylenically unsaturated polyetherurethane composition having no free NCO, being readily removable from a substrate by an alkaline water wash and being capable of being polymerized by actinic light to yield a solid having a Shore A hardness of at least 30, said composition being composed of a polyetherurethane consisting essentially of reaction products of polyether polyol having 2 to 3 hydroxyls, organic polyisocyanate and hydroxyl acrylate or methacrylate having an alkyl radical containing 2 to 3 carbon atoms and sufficient polyethylene polyol acrylate or methacrylate to give the composition a viscosity at 24° C. of 2,000 to 10,000 centipoises.

2. The polyetherurethane composition of claim 1 containing 10 to 85 percent of an ethylenic monomer on the composition basis, said monomer being a hydroxy alkyl acrylate or methacrylate, with said alkyl radical containing 2 to 3 carbon atoms or being a hydroxyalkoxy acrylate or methacrylate where the alkoxy is a radical containing from 1 to 10 repeating groups of the formula (—$C_2H_4O$—) or (—$C_3H_6O$—).

3. The polyetherurethane composition of claim 1 which contains a photosensitizer.

4. The polyetherurethane composition of claim 3 containing sufficient diluent to give the composition a viscosity at 25° C. of 3,000 to 6,000 centipoises and the diluent is polyethylene either polyol acrylate or methacrylate where polyethylene ether polyol has a molecular weight of 200 to 6000.

5. The polyetherurethane composition of claim 3 wherein the photosensitizer is benzoin isobutyl ether or 2,2-diethoxyacetophenone.

6. The liquid composition of claim 1 wherein the polyetherurethane is the reaction product of isophorone diisocyanate and a polyether polyol of 2 to 3 hydroxyls having a carbon to oxygen ratio greater than 2.0 but less than 3.0.

7. The liquid composition of claim 1 wherein the polyetherurethane is the reaction product of isophorone diisocyanate polyether polyol of 2 to 3 hydroxyls having a carbon to oxygen ratio greater than 2.0 but less than 3.0 and hydroxyalkyl acrylate or methacrylate with the alkyl radical containing 2 to 3 carbon atoms.

8. The composition of claim 7 containing sufficient diluent to give a viscosity at 24° C. of 3000 to 6000 centipoises and the diluent is a diacrylate or dimethacrylate of a polyethylene ether polyol of 200 to 6000 molecular weight.

9. The composition of claim 8 containing sufficient photopolymerization initiator to effect polymerization of the composition having a Shore A hardness of at least 30 in two minutes.

10. The polyetherurethane composition of claim 1 wherein the polyetherurethane has a polyether portion having a carbon to oxygen ratio greater than 2.0 but less than 3.0.

* * * * *

UNITED STATES PATENT AND TRADEMARK OFFICE
CERTIFICATE OF CORRECTION

PATENT NO. : 4,057,431

DATED : November 8, 1977

INVENTOR(S) : Anthony F. Finelli, Shirish Jasani, and Columbus Williams, Jr.

It is certified that error appears in the above-identified patent and that said Letters Patent are hereby corrected as shown below:

In the Abstract, Line 1, "polurethane" should be --polyurethane--

In Column 4, Line 53, "unsatisfactory" should be --satisfactory--

In Column 8, Line 58, Claim 4, "either" should be --ether--.

Signed and Sealed this

Nineteenth Day of September 1978

[SEAL]

Attest:

RUTH C. MASON
Attesting Officer

DONALD W. BANNER
Commissioner of Patents and Trademarks